US008957457B2

(12) United States Patent
Fournel et al.

(10) Patent No.: US 8,957,457 B2
(45) Date of Patent: Feb. 17, 2015

(54) METHOD FOR MANUFACTURING A SEMICONDUCTOR CHIP STACK DEVICE

(75) Inventors: Richard Fournel, Lumbin (FR); Pierre Dautriche, Meylan (FR)

(73) Assignee: STMicroelectronics SA, Montrouge (FR)

( * ) Notice: Subject to any disclaimer, the term of this patent is extended or adjusted under 35 U.S.C. 154(b) by 355 days.

(21) Appl. No.: 13/302,884

(22) Filed: Nov. 22, 2011

(65) Prior Publication Data
US 2012/0126230 A1 May 24, 2012

(30) Foreign Application Priority Data

Nov. 22, 2010 (FR) .................................... 10 59594

(51) Int. Cl.
*H01L 27/118* (2006.01)
*H01L 25/065* (2006.01)
*H01L 25/00* (2006.01)

(52) U.S. Cl.
CPC ............ *H01L 25/0657* (2013.01); *H01L 25/50* (2013.01); *H01L 2225/06513* (2013.01); *H01L 2225/06527* (2013.01); *H01L 2225/06593* (2013.01); *H01L 2225/06596* (2013.01); *H01L 2224/16* (2013.01)
USPC ........... 257/203; 257/208; 257/777; 257/798; 257/E23.179; 257/E21.499

(58) Field of Classification Search
CPC ................. H01L 2924/00; H01L 2924/15311; H01L 24/97; H01L 2225/06517; H01L 2224/82; H01L 23/49816; H01L 21/50; H01L 23/48; H01L 2225/1058; H01L 25/00; H01L 2224/0401; H01L 22/34; H01L 23/52
USPC ........ 257/203, 208, 686, 777, 778, 786, 797, 257/E23.179, E21.499, E21.506
See application file for complete search history.

(56) References Cited

U.S. PATENT DOCUMENTS

| 7,808,075 | B1 | 10/2010 | Cheng et al. ................... 257/528 |
| 2003/0062611 | A1 | 4/2003 | Shibata .......................... 257/686 |
| 2004/0018654 | A1* | 1/2004 | Drost et al. ..................... 438/17 |
| 2005/0161837 | A1 | 7/2005 | Matsui |
| 2009/0085183 | A1* | 4/2009 | Mitchell et al. ............... 257/686 |

OTHER PUBLICATIONS

3D Wafer-Level Packaging (3D-WLP), URL=http://www.imec.be/ScientificReport/SR2007/html/1384073.html, download date Oct. 23, 2009.

(Continued)

*Primary Examiner* — Benjamin Sandvik
*Assistant Examiner* — Leslie Pilar Cruz
(74) *Attorney, Agent, or Firm* — Seed IP Law Group PLLC

(57) ABSTRACT

A method for manufacturing a semiconductor chip stack device is provided. The method includes forming a first connecting element array on a surface of a first semiconductor chip; forming a second connecting element array on a surface of a second semiconductor chip, the second array comprising more connecting elements than the first array and the pitch of the first array being a multiple of the pitch of the second array; applying the first chip against the second chip; and setting up test signals between the first and second chips to determine the matching between the connecting elements of the first array and the connecting elements of the second array.

19 Claims, 2 Drawing Sheets

(56) References Cited

OTHER PUBLICATIONS

Farrens, S. et al., "Bonding Solutions for 3D Integration," Advanced Packaging 17(3):29-32, 2008.

Lu, J.-Q. et al., "Wafer-Level Assembly of Heterogeneous Technologies," in 2003 International Conference on Compound Semiconductor Manufacturing Technology, GaAsMantech, Scottsdale, Arizona, May 19-22, 2003, pp. 91-94.

Lu, J.-Q. et al., "Planarization Issues in Wafer-Level Three-Dimensional (3D) Integration," MRS Symposium Proceedings, Advances in Chemical-Mechanical Polishing vol. 816, Materials Research Society, Spring 2004, pp. K7.7.1-K7.7.12.

Lu, J.-Q. et al., "Die-on Wafer and Wafer-Level Three Dimensional (3D) Integration of Heterogeneous IC Technologies for RF-Microwave-Millimeter Applications," MRS Symposium Proceedings, Materials, Integration and Packaging Issues for High-Frequency Devices II vol. 833, Materials Research Society, Fall 2004, pp. G6.8.1-G6.8.6.

Matthias, Thorsten et al., "3D Process Integration—Wafer-to-Wafer and Chip-to-Wafer Bonding," MRS Symposium Proceedings, Enabling Technologies for 3-D Integration vol. 970, Materials Research Society, Fall 2006, pp. 970-Y04-08.

\* cited by examiner

METHOD FOR MANUFACTURING A SEMICONDUCTOR CHIP STACK DEVICE

BACKGROUND

1. Technical Field

The present disclosure relates to semiconductor chip stack devices. It more generally relates to the creation of an electric connection between two stacked chips.

2. Description of the Related Art

In chip stack devices, semiconductor chips or wafers are stacked. The chips are for example appended with their front or back sides against each other, or one's front side against the other's back side, and are interconnected. This assembly mode especially enables an increase in the number of functions carried out by the device without increasing the occupied surface area. Although chip assemblies will be mentioned in the present description, it should be clear that said chips may be plates, semiconductor wafers, or elements of semiconductor wafers.

FIG. 1 is a perspective view schematically showing a step of assembly of two semiconductor chips, respectively 1 and 2, of a chip stack device. In this example, chips 1 and 2 have their front sides against each other. Connecting elements 10 are arranged in an array of rows and columns formed on the front side of chip 1. A corresponding array of connecting elements 20, of the same pitch, is formed on the front side of chip 2. Connecting elements 10 and 20 are, for example, copper pads or pillars. On assembly of the chips, each connecting element 10 of chip 1 comes into contact with the connecting element 20 of chip 2.

During the actual assembly step, chips 1 and 2 are pressed against each other and attached, for example by molecular bonding or by soldering of connecting elements 10 onto connecting elements 20. The issue of aligning chips 1 and 2 appears in this step. The alignment must be sufficiently accurate to ensure for each connecting element 10 of chip 1 to be positioned, at least partially, in front of the corresponding connecting element 20 of chip 2, so that an electric connection can be created between the two connecting elements 10 and 20. Thus, the alignment inaccuracy margin must be smaller than the width of the connecting element. In the shown example, chip 2, is of a larger surface area than chip land comprises corners or guide marks 14' to make the alignment easier.

The current tendency of decreasing connecting element dimensions and increasing the number of connecting elements per surface area unit makes this alignment operation particularly critical. As an illustration, connecting elements having a width ranging between 1 and 5 µm, or even smaller, can now be formed. Now, the machines used to assemble chips currently have an alignment inaccuracy margin on the order of 10 µm. A better accuracy could possibly be obtained, however causing in return an undesirable increase in assembly times and manufacturing costs.

FIG. 2 is a cross-sectional view of the chip stack device of FIG. 1 after assembly. In the shown example, chips 1 and 2 have not been properly aligned. As a result, connecting element 10a of chip 1, instead of being in contact with the corresponding connecting element 20a of chip 2, are in contact with neighboring connecting element 20b. Further, some peripheral connecting elements 10c of chip 1 (to the right of the drawing) are in contact with no connecting elements 20 of chip 2, and some peripheral connecting elements 20a of chip 2 (to the left of the drawing) are in contact with no connecting elements 10 of chip 1. Such a device will not operate correctly. Generally, the alignment issue is one of the main factors limiting the efficiency of chip stack device manufacturing chains, especially when connecting elements of small dimensions are used.

BRIEF SUMMARY

An embodiment of the present disclosure provides a method for manufacturing a chip stack device.

An embodiment provides such a method enabling to improve the manufacturing efficiency of chip stack devices, especially when connecting elements of small size are used to interconnect the chips.

An embodiment provides such a method which does not increase the duration and the cost of chip assembly steps.

An embodiment provides such a method which is easy to implement, and which can in particular be implemented by only using standard electronic device manufacturing steps.

An embodiment provides a method for manufacturing a semiconductor chip stack device, comprising the steps of: forming a first connecting element array with first connecting elements on a first surface of a first semiconductor chip; forming a second connecting element array of second connecting elements on a second surface of a second semiconductor chip, the second array comprising more connecting elements than the first array and a first pitch of the first array being a multiple of a second pitch of the second array; applying the first chip against the second chip; and setting up test signals between the first and second chips to determine electrical communication between the first connecting elements of the first array and the second connecting elements of the second array.

The second chip comprises second conductive tracks and branching means between the second connecting elements of the second array and the second conductive tracks. The method further includes a branching step to connect to the second conductive tracks those of the second connecting elements of the second array that are in contact with the first connecting elements of the first array. The branching step can be performed after setting up the test signals.

According to another embodiment, the application of the first chip against the second chip has an alignment inaccuracy margin, and the differences in dimensions between the first and second arrays are selected to cover at least this margin and preferably at least twice this margin. The first chip transmits a test signal via at least two of the first connecting elements of the first array. The first chip successively transmits a test signal via each of the first connecting elements of the first array.

In one embodiment, the first and second connecting elements of the first and second arrays are copper pillars. The first and second connecting elements of the first and second arrays have a width smaller than 5 µm.

According to another embodiment, the first connecting elements have a first width. Adjacent second connecting elements of the second array are separated by a space ranging between 1.1 and 1.5 times the first width of the first connecting element of the first array. In another embodiment, the second connecting elements have a second width. Adjacent first connecting elements of the first array are separated by a space ranging between 1.1 and 1.5 times the second width of the second connecting element of the second array.

Another embodiment provides an electronic device comprising first and second stacked semiconductor chips, wherein: the first and second chips respectively comprise first and second arrays of first and second connecting elements, respectively; the second array comprising more second connecting elements than the first array and a pitch of the first array is a multiple of a pitch of the second array; and the first connecting elements of the first array are in contact with the second connecting elements of the second array, this device further comprises means for setting up test signals between the first and second chips and means to determine if alignment or matching is achieved between the first connecting elements of the first array and the second connecting elements of the second array.

According to an embodiment, the second chip comprises second conductive tracks and branching means between the second connecting elements of the second array and the second conductive tracks for connecting to the second conductive tracks those of the second connecting elements of the second array which are in contact with first connecting elements of the first array.

The foregoing and other objects, features, and advantages will be discussed in detail in the following non-limiting description of specific embodiments in connection with the accompanying drawings.

DETAILED DESCRIPTION

Figure 1:
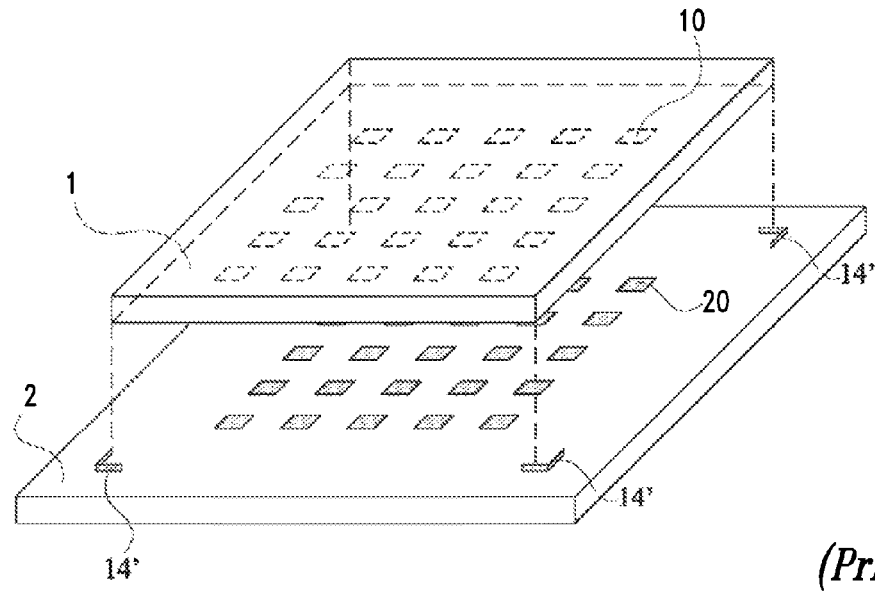
FIG. 1 is a perspective view schematically showing a known step of assembly of two semiconductor chips of a chip stack device.

For clarity, the same elements have been designated with the same reference numerals in the different drawings and, further, as usual in the representation of integrated circuits, the various drawings are not to scale.

Figure 3:
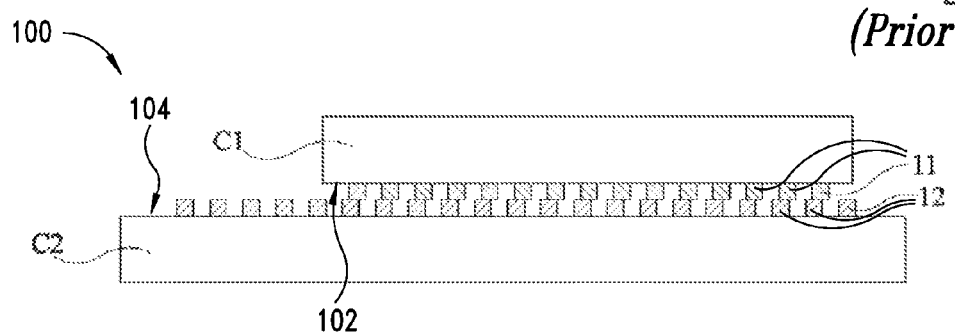
FIG. 3 is a cross-sectional view schematically showing an embodiment of a chip stack device.

FIG. 3 is a cross-sectional view schematically showing an embodiment of a chip stack device 100 comprising a first and a second semiconductor chip, respectively C1 and C2. The first chip C1 has a front side 102 and the second chip C2 has a front side 104 facing the front side 102 of the first chip C2.

An assembly of first connecting elements 11, arranged in an array of rows and columns, is formed on the front side 102 of the first chip C1. An assembly of corresponding second connecting elements 12, arranged in an array of same pitch, is formed on the front side 104 of chip C2. Here and in the following description, term "connecting elements" is used to designate protruding copper pillars, conductive contact areas capable of receiving interconnection bumps, the ends of metal vias crossing through a substrate of one of the chips, or any other known electric connection device. Among such devices, connections by capacitive or inductive coupling, in which the conductive electrodes of chip C1 and the conductive electrodes of chip C2 do not come directly into contact with one another, but are separated by an insulating layer, will especially be mentioned. This type of connecting element has the advantage that it can have very small dimensions, which enables to provide a high density of connecting elements. In the shown example, connecting elements 11 and 12 have the same width. The present disclosure is however not limited to this specific case.

Figure 2:
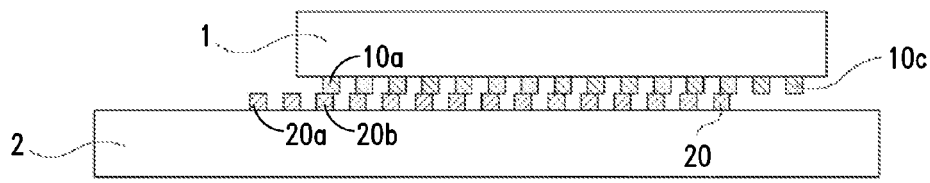
FIG. 2 is a cross-sectional view schematically showing misalignment of a chip stack device.

Conversely to assemblies of the type described in relation with FIGS. 1 and 2, the second array of second connecting elements 12 of chip C2 here has greater dimensions than the first array of first connecting elements 11 of chip C1, that is, it comprises a greater number of rows and/or of columns than the first array of first connecting elements 11 of chip C1. Thus, not only is each first connecting element 11 of chip C1 capable of contacting one of the second connecting elements 12 of chip C2, but there also exist several relative positions of chip C1 with respect to chip C2 for which each first connecting element 11 contacts one second connecting element 12. This enables compensation for possible alignment inaccuracies during the assembly.

It is provided to perform the step of assembly of the two chips with an accuracy of acceptable industrial cost. An inaccuracy margin greater than the width of a connecting element may especially be allowed, the single constraint being for the first array of first connecting elements 11 of chip C1 to remain in front of the second array of second connecting elements 12 of chip C2.

The number of excess second connecting elements 12 of the second array of chip C2 with respect to the first array of chip C1 may be selected to cover at least the alignment inaccuracy margin of assembly machines, and preferably at least twice this margin. As an illustration, if the connecting elements have a width of 1 μm and are separated by a space of 1.5 μm, and if the alignment accuracy of the assembly machine is of plus or minus 5 μm in each direction of the array, it may be provided for the second array of second connecting elements 12 of chip C2 to be 20 μm wider and 20 μm longer than the first array of first connecting elements 11 of chip C1. Thus, the second array of chip C2 will comprise 8 more lines and 8 more columns than the first array of chip C1.

As will be explained in further detail hereafter, chips C1 and C2 comprise alignment recognition means (not shown in FIG. 3). In a step subsequent to the chip assembly, for example, when the device is powered on, an alignment recognition protocol establishes between chips C1 and C2, which includes the exchange of test signals between first connecting elements 11 of chip C1 and second connecting elements 12 of chip C2. This protocol enables determining if the first connecting elements 11 are aligned with or matched up with the second connecting elements 12, that is, it enables the second chip C2 to determine which of the second connecting elements 12 are in contact with the first connecting elements 11 of the first chip C1, and for each second connecting element 12 in contact with one of the first connecting elements 11, the coordinates of the associated first connecting element 11. More particularly, the protocol establishes electrical communication between the first connecting elements 11 and the second connecting elements.

The second chip C2 further comprises branching or addressing means (not visible in FIG. 3) which form an interface between the second connecting elements 12 and second conductive tracks of the second chip C2, these tracks being for example arranged in one or several data transmission buses. The branching means for example comprise MOS transistors. Once the matching or alignment of the first and second connecting elements 11 and 12 has been determined, the branching means adequately connect those of the second connecting elements 12 which are in contact with the first connecting elements 11 to the second tracks of the signal transmission bus(es).

A non-volatile memory is preferably provided, in the second chip C2, or associated with the second chip C2, to store the data relative to the alignment and to the matching of the first and second connecting elements 11 and 12. Thus, it will be sufficient to implement the alignment recognition step once, for example, at the first powering on of the device.

If the distance between two adjacent ones of the second connecting elements 12 is shorter than a first width of one of the first connecting elements 11, there is a risk that, during the assembly, the first connecting element 11 of the first chip C1 will short-circuit two of the second connecting elements 12 of chip C2 (and conversely). Further, if the distance between two adjacent ones of the second connecting elements 12 is shorter than the first width of one of the first connecting elements 11, there is a risk that, during the assembly, one of the first connecting elements 11 of chip C1 interposes between two adjacent ones of the second connecting elements 12 and is in contact with none of the second connecting elements (and conversely).

To avoid any short-circuit risk and to minimize risks of there being no connection, a spacing between connecting elements slightly greater than the width of a connecting element of the other array, for example, ranging between 1.1 and 1.5 times the width of a connecting element of the other array, is preferably selected for each array of connecting elements.

Figure 4:
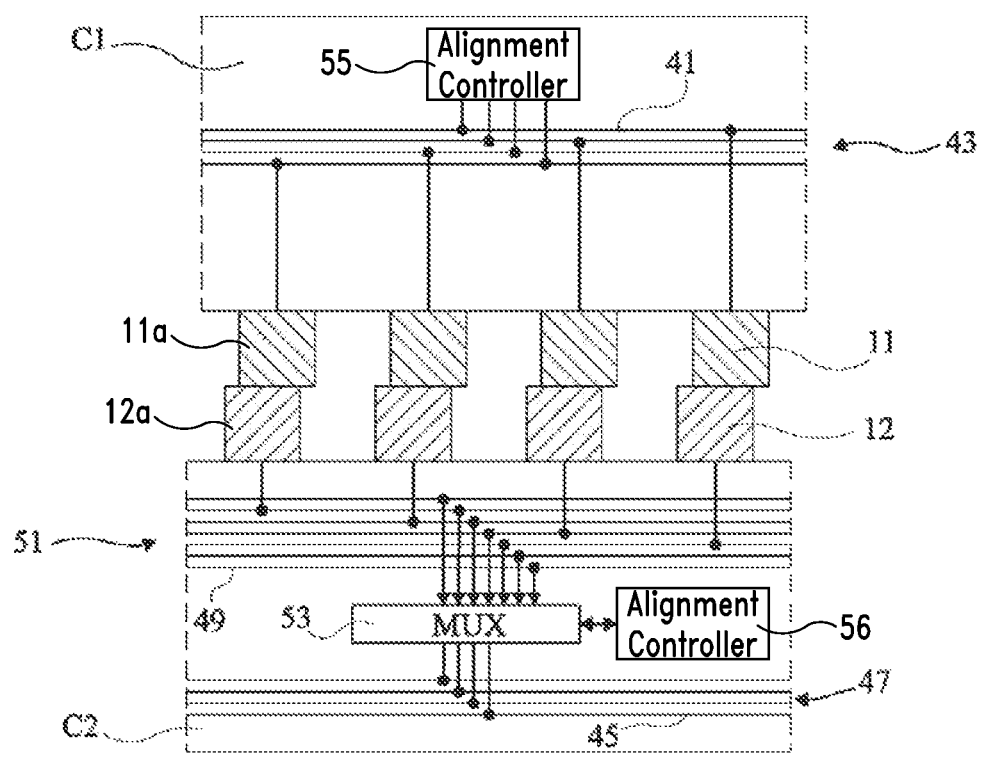
FIG. 4 is a partial simplified cross-sectional view showing in further detail an embodiment of a chip stack device.

FIG. 4 is an enlarged view of a portion of the chip stack device of FIG. 3. FIG. 4 especially schematically illustrates an embodiment of the alignment recognition means and of the means for branching back to the second connecting elements 12 of the second chip C2.

The first connecting elements 11 of chip C1 are connected to first conductive tracks 41 internal to chip C1, the first tracks 41 altogether forming a first signal transmission bus 43.

The second chip C2 also comprises second conductive tracks 45 arranged in a second signal transmission bus 47. In this example, the second bus 47 of chip C2 comprises the same number of conductive tracks as the first bus 43 of chip C1, for example corresponding to the number of first connecting elements 11 of chip C1.

Each of the second connecting elements 12 of chip C2 is connected to an intermediary third conductive track 49, the third tracks 49 altogether forming an intermediary bus 51. A multiplexer 53 forms an interface between intermediary bus 51 and the second bus 47.

Chips C1 and C2 further respectively comprise first and second alignment recognition controllers 55 and 56, respectively, capable of implementing a protocol of alignment recognition between chips. The first controller 55 of chip C1 accesses the first connecting elements 11 via the first bus 43. The second controller 56 of chip C2 is connected to multiplexer 53, and accesses the second connecting elements 12 via the multiplexer and the intermediary bus 51.

The second controller 56 of chip C2 can control multiplexer 53 to branch connecting elements 12 back to the second bus 47 when the alignment recognition is over.

Various alignment recognition protocols may be used to determine the matching of connecting elements 11 and 12. In one of the simplest protocols, chip C1 may sequentially transmit, from each of the first connecting elements 11, a test signal. Chip C2 can thus know which of the second connecting elements 12 are connected to one of the first connecting elements 11. The order of test signal reception by chip C2 enables a determination, for each of the second connecting elements 12 in contact with one of the first connecting elements 11, the coordinates of the associated first connecting element 11.

According to another example of an alignment recognition protocol, chip C1 transmits test signals, via two predetermined first reference connecting elements 11, for example located in opposite peripheral regions of the first array of first connecting elements 11. Chip C2 knows the coordinates of first reference connecting elements 11. Thus, when it locates the second connecting elements 12 excited by the test signals, it can deduce the alignment of chip C1.

As a variation, a secure alignment recognition protocol comprising the following steps may be provided:

a) chip C1 transmits, via a connecting element 11a, a random number N1;

b) connecting element 12a of chip C2 excited by connecting element 11a successively sends back to connecting element 11a number N1' corresponding to a transformation of number N1 specific to chip C2 and a new random number N2;

c) chip C1 verifies that the transformation of number N1 into N1' is valid, and sends to connecting element 12a number N2' corresponding to a transformation of number N2 specific to chip C1, as well as the coordinates of connecting element 11a;

d) chip C2 verifies that the transformation of number N2 into N2' is valid, and stores the coordinates of connecting element 11a.

These steps may be repeated for all of the first connecting elements 11 of chip C1, or for some of the first connecting elements 11 only. In this last case, chip C2 may deduce the coordinates of the other first connecting elements 11 from the received coordinates.

An advantage of the provided method is that it improves the manufacturing efficiency of chip stack devices, especially when connecting elements of small size, for example, having a width smaller than 5 μm, are used to interconnect the chips. This method minimizes efficiency decreases due to alignment inaccuracies of assembly machines. It may even possibly be envisaged to decrease the accuracy of assembly machines to increase assembly rates.

Another advantage of the provided method is that it comprises no additional manufacturing step with respect to usual methods.

Specific embodiments of the present disclosure have been described. Various alterations and modifications will occur to those skilled in the art. In particular, the present disclosure is not limited to the examples of means of alignment recognition and for branching back the connecting elements described in relation with FIG. 4. Other means within the abilities of those skilled in the art will enable to obtain the desired effect.

Further, the present disclosure is not limited to assemblies in which the connecting elements are arranged in arrays of rows and columns. Any other arrangement in which the connecting elements are arranged according to a regular pattern may be used.

Embodiments where an assembly of the first connecting elements arranged in the first array is formed on chip C1, and where an assembly of the corresponding second connecting elements arranged in the second array is formed on chip C2, both arrays having the same pitch and the second array of chip C2 comprising more second connecting elements than the first array of chip C1, have been mentioned hereabove. The present disclosure is not limited to the case where both arrays have the same pitch. In addition, the first pitch of the first array of chip C1 can be a multiple greater than 1 of the second pitch of the second array of chip C2.

Further, the present disclosure is not limited to the example described in relation with FIGS. 3 and 4, in which the chips of the stack are appended with their front sides against each other. The chip stack can be position in other orders and directions.

Such alterations, modifications, and improvements are intended to be part of this disclosure, and are intended to be within the spirit and the scope of the present disclosure. Accordingly, the foregoing description is by way of example only and is not intended to be limiting.

What is claimed is:

1. An electronic device, comprising:
a first semiconductor chip having a first array of first connecting elements, the first connecting elements having a first pitch;
a second semiconductor chip stacked on the first semiconductor chip, the second semiconductor chip having a second array of second connecting elements, the second connecting elements having a second pitch, the second array having more of the second connecting elements than the first connecting elements of the first array, all of the first connecting elements of the first array being in contact with corresponding ones of the second connecting elements of the second array, and the first pitch of the first array being a multiple of the second pitch of the second array;
first and second alignment recognition controllers in the first and second semiconductor chips, respectively, the first and second alignment recognition controllers being configured to determine a position of the first semiconductor chip with respect to the second connecting elements of the second semiconductor chip, the first alignment recognition controller being configured to transmit at least one test signal from the first connecting elements of the first semiconductor chip to ones of the second connecting elements of the second semiconductor chip that are electrically coupled to the first connecting elements and configured to detect the ones of the second connecting elements that receive the at least one test signal; and
a switching element in the second semiconductor chip, the switching element being coupled to the second array of second connecting elements and the second alignment recognition controller, the second semiconductor chip having an array of signal lines, the second alignment recognition controller being configured to control the switching element to couple a subset of the second array of the second connecting elements to the array of signal lines based on the test signal.

2. The device of claim 1, wherein the first semiconductor chip includes first conductive tracks, the switching element is configured to couple the first connecting elements of the first array to the array of signals lines through the subset of the second connecting elements of the second array.

3. The device of claim 1, wherein the switching element includes connecting elements with transistors, the transistors being electrically coupled to the first connecting elements through the second connecting elements in direct contact with the first connecting elements.

4. An electronic device, comprising:
a first semiconductor chip including:
a first array of connecting elements;
a first bus coupled to the first array of connecting elements, the first bus having a first plurality of signal lines; and
a first alignment controller coupled to the first plurality of signal lines and configured to transmit a first alignment signal; and
a second semiconductor chip including:
a second array of connecting elements;
a second bus coupled to the second array of connecting elements, the second array of connecting elements being greater in number than the first array of connecting elements, the second bus having a second plurality of signal lines, the second plurality of signal lines being greater in number than the first plurality of signal lines, the first array of connecting elements being fixably attached and electrically coupled to a subset of the second array of connecting elements;
a second alignment controller coupled to the second plurality of signal lines, the second alignment controller configured to receive the first alignment signal through at least one of the subset of the second array of connecting elements;
a third bus having a third plurality of signal lines, the second plurality of signal lines being greater in number than the third plurality of signal lines; and
a selector configured to couple ones of the second plurality of signal lines to the third plurality of signal lines, the second alignment controller configured to control the selector based on the first alignment signal received through the at least one of the subset of the second array of connecting elements.

5. The device of claim 4, wherein the second alignment controller is configured to determine an offset between the connecting elements of the first array and corresponding ones of the connecting elements of the second array.

6. The device of claim 5, wherein the second alignment controller is configured to provide the offset to the selector, the selector being configured to use the offset to select and couple the ones of the second plurality of signal lines to the third plurality of signal lines.

7. The device of claim 4, wherein the first array spans a first surface area of the first semiconductor chip, the second array spans a second surface area of the second semiconductor chip, and the second surface area is greater in size than the first surface area.

8. The device of claim 4, wherein each connecting element of the first array is directly coupled to one of the connecting elements of the second array.

9. The device of claim 4, wherein the first array has a first pitch between the first connecting elements, and the second array has a second pitch between the second connecting elements that is different than the first pitch of the first connecting elements.

10. The device of claim 4, wherein the selector includes a multiplexer.

11. The device of claim 4, wherein one of the connecting elements is less than 5 μm in length.

12. The device of claim 4, wherein the first plurality of signal lines is equal in number to the third plurality of signal lines.

13. An electronic system, comprising:
a first semiconductor chip having:
a first array of connecting elements;
a first alignment controller coupled to the first array of connecting elements, the first alignment controller configured to transmit a signal through the first array of connecting elements; and
a second semiconductor chip having:
a second array of connecting elements, the connecting elements of the first array being electrically coupled to a subset of the connecting elements of the second array;
a second alignment controller coupled to the second array of connecting elements and configured to receive the signal from the first alignment controller through the subset of connecting elements of the second array coupled to the first array; and
a selector coupled to the second array and the second alignment controller, the second alignment controller configured to control the selector based on the signal transmitted through the subset of the connecting elements of the second array.

14. The system of claim 13, wherein the first array has a first surface area on the first semiconductor chip, the second array has a second surface area on the second semiconductor chip that is greater in size than the first surface area.

15. The system of claim 13, wherein the first semiconductor chip includes a first bus configured to transmit a first plurality of signals, and the second semiconductor chip includes a second bus configured to transmit a second plurality of signals and a third bus configured to transmit a third plurality of signals, the second plurality of signals being larger than each of the first plurality of signals and the third plurality of signals, and the selector being configured to couple the first bus to the third bus based on the signal transmitted from the first alignment controller.

16. The system of claim 13, wherein each one of the connecting elements of the first array is coupled to one of the connecting elements of the second array.

17. The system of claim 13, wherein the first array has a first pitch between the connecting elements, the second array has a second pitch between the connecting elements that is different from the first pitch of the first array.

18. The system of claim 13, wherein the selector includes a multiplexer.

19. The system of claim 13, wherein the connecting elements are less than 5 μm in length.

* * * * *

UNITED STATES PATENT AND TRADEMARK OFFICE
CERTIFICATE OF CORRECTION

PATENT NO. : 8,957,457 B2
APPLICATION NO. : 13/302884
DATED : February 17, 2015
INVENTOR(S) : Richard Fournel et al.

It is certified that error appears in the above-identified patent and that said Letters Patent is hereby corrected as shown below:

In the Claims
Column 7, Line 46:
"includes connecting elements with transistors, the transistors" should read, --includes transistors, the transistors--.

Signed and Sealed this
Twenty-ninth Day of March, 2016

Michelle K. Lee
*Director of the United States Patent and Trademark Office*